Jan. 26, 1965 C. E. WELLER 3,167,722

AGC UNIT USING PHOTOCONDUCTORS

Filed Nov. 20, 1961

INVENTOR:
C. E. WELLER
BY: Theodore E. Bieber
HIS ATTORNEY

United States Patent Office 3,167,722
Patented Jan. 26, 1965

3,167,722

AGC UNIT USING PHOTOCONDUCTORS

Charles E. Weller, Houston, Tex., assignor to Shell Oil Company, New York, N.Y., a corporation of Delaware Filed Nov. 20, 1961, Ser. No. 153,390
5 Claims. (Cl. 330—59)

This invention pertains to amplifiers and more particularly to automatic gain control, hereinafter referred to as "AGC" unit for amplifiers, particularly single-ended amplifiers.

All amplifiers used in amplifying variable amplitude signals require some means of gain or voltage control to prevent overloading of the amplifier, the most effective method being the automatic gain control. The customary AGC unit utilizes some means for varying the bias voltage applied to the grid of the amplifying tubes. Generally, this control is effected by utilizing a condenser that is charged during periods of high amplitude signal and then discharges during periods of low amplitude signals into the grid circuit to control the voltage gain of a vacuum tube. This type of circuit has several disadvantages, the greatest being the non-uniformity of the AGC reaction rates with signal input level. The reaction rates are (*a*) the compression rate which is defined as the rate at which the amplifier output signal approaches its new steady-state level upon the application of an abrupt increase in the input signal envelope, and (*b*) the expansion rate which is the measure of the rate at which the amplifier recovers sensitivity upon an abrupt decrease in the magnitude of the input signal. These two reaction rates are usually defined for a 10 decibel step of the input signal envelope. The non-uniformity in both reaction rates with signal input level, arises as the result of the non-logarithmic envelope transmission characteristics of the controlled amplifier. Also, this method requires carefully balanced push-pull stages of signal application in order to cancel out transients arising from the changing control voltage.

Alternatively, AGC units using diode bridges have been developed. When certain types of semi-conductor diode bridges are used in voltage divider circuits disposed on the input side of the amplifier, their dynamic resistance will vary logarithmically with the applied direct current voltage. Thus, one obtains substantially uniform AGC reaction rates with signal input level. This result is only true if the bridge is disposed in an unloaded circuit and driven from a current source. Of course, in all practical circuits there is a finite source and load resistance, thus the AGC reaction rates tend to decrease with decreasing input levels.

Accordingly, it is the principal object of this invention to provide a novel AGC unit in which the AGC reaction rates, for a given logarithmic input step, remain substantially constant over the entire dynamic range of input signals to be controlled by the amplifiers.

A further object of this invention is to provide an AGC unit in which a substantially pure resistance element is disposed in the gain control section of an amplifier resulting in minimal distortion.

The above objects and advantages of this invention are achieved by utilizing photoconductive devices that are disposed in the gain control portion of an amplifier. The output signal of the amplifier is passed through an envelope-detecting circuit consisting of a rectifier and an integrator with the time constants of the integrating circuit being chosen to obtain the response rates desired for the AGC unit. The output of the integrating circuit is applied to a direct current amplifier having non-linear transfer characteristics. The output of this non-linear D.C. amplifier is used to de-energize a light source, such as a tungsten filament lamp, disposed to illuminate one or several photoconductive devices, the number depending on the maximum dynamic control range to be achieved. The photoconductive device is selected so that its conductivity varies with the applied illumination and preferably consists of one or more solid state photoconductivity devices, for example cadmium selenide cells behaving substantially as pure ohmic resistances at any given level of illumination.

The signal amplifier consists of several single-ended stages of amplification, each stage being an operational feedback amplifier having a photoconductive cell as its gain determining resistor. Although, as a rule, the resistance of the photoconductor varies non-logarithmically with the voltage or current applied to the light source, the non-linear D.C. amplifier renders the over-all attenuation characteristics logarithmic.

The above objects and advantages of this invention will be more easily understood from the following detailed description of a preferred embodiment when taken in conjunction with the attached drawings, in which.

This invention utilizes solid state photoconductors and preferably a cadmium selenide cell consisting of a thin layer of sensitized CdSe disposed between metallic electrodes. As light falls upon the element, photoconductivity occurs with the absorption of radiation and the resulting conductivity of the element increases. The peak response of the device having this construction is in the range of 7,000 angstrom units. When a tungsten filament bulb is used to illuminate the photoconductive element and when the power through the bulb is from either a current or a voltage source the conductance of the cell will vary neither linearly nor logarithmically with the voltage or current applied to the bulb. Thus, if one desires to use a photoconductive element as the control element of an AGC unit having ideal dynamic characteristics the tungsten filament bulb must be energized through a non-linear direct-current amplifier in order to render the over-all response logarithmic.

Photoconductors in addition have the property of being substantially pure resistance type elements and thus may be used directly in the gain control section of an amplifier without introducing distortion in the amplifier. This fact makes it possible to use single-ended circuits throughout the amplifier and eliminate the need for push-pull or other balanced circuits commonly required with AGC units.

Figure 1:
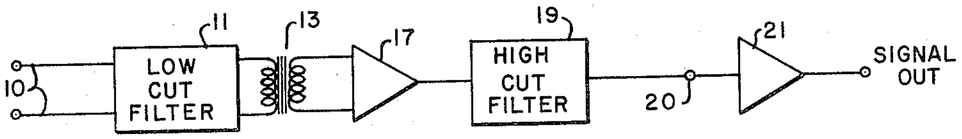
FIGURE 1 is a block diagram of an AGC unit constructed in accordance with this invention.
Figure 2:
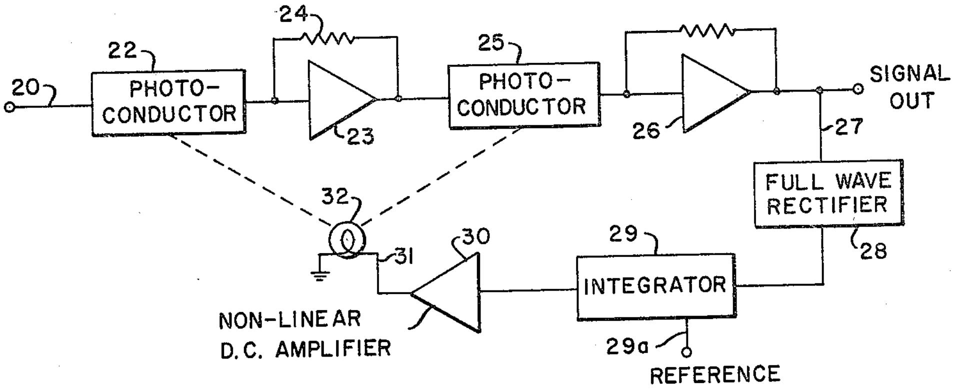
FIGURE 2 is a block diagram of the gain controlled section of the AGC unit shown in FIGURE 1; and, FIGURE 3 is a schematic diagram of the non-linear amplifier shown in FIGURE 2.

Referring now to FIGURE 1, there is shown a block diagram of a typical seismic amplifier arrangement. The input signal is supplied to the terminals 10 which supply the signal to a low cut filter arrangement 11. Various types of filters are well known in the seismic field and the filter 11 should be constructed to pass only the higher frequency of the seismic signal and discriminate against all others. The normal frequency range for the low pass filter is approximately 10 to 200 cycles per second. The low pass filter 11 is coupled first to a fixed-gain preamplifier through the transformer 13. The preamplifier 17 is coupled to the high-cut filter 19 which should be so constructed to pass only the lower frequency of the seismic signal. Its normal frequency range is approximately 15 to 250 cycles. Filters 11 and 19 together form a band-pass filter having selectable slopes and cut-off frequencies as is well known in the seismic art. The high-cut filter 19 is coupled to the AGC amplifier 21 whose gain is controlled automatically by the signal arriving at its input terminals 20. FIGURE 2 shows a detailed diagram of the AGC amplifier 21. The filtered signal appearing at 20 is coupled through a photoconductive element 22 to an amplifier 23. Amplifier 23 is provided with negative feedback through the resistance 24 and the photoconductive element 22, and hence the photoconductive element 22 is disposed in the gain control section of the amplifier 23. The components of 22, 23 and 24 thus form an operational amplifier whose gain is determined by the resistance offered by the photoconductor 22. The output signal of the amplifier 23 is supplied to a second amplifier 26 through a second photoconductive element 25. The amplifier 26 is substantially the same as the amplifier 23 and is also provided with a negative feedback circuit.

The output side of the amplifier 26 is coupled by means of a lead 27 to a full wave rectifying circuit 28 to rectify the output signal from the amplifier 26. The output signal from the rectifying circuit 28 is coupled to an integrating circuit 29, which may be a conventional RC integrator or an operational integrating amplifier shown in the prior art. The time constant of the integrator 29 is chosen to provide an integrating time constant that is related to the rate of gain expansion and gain compression desired of the AGC unit. By varying the value of the components of the integrator 29 one may control the rate of gain expansion and gain compression of the AGC unit and thus its transient response. Circuits 28 and 29 together constitute a detector for the varying envelope of the signal. Lead 29*a* is connected to a constant reference voltage which establishes the AGC threshold or "delay." The output signal from the integrator 29 is coupled to a non-linear direct current amplifier of any well known design. The amplifier 30 is coupled by means of a lead 31 to a tungsten filament bulb 32. While the tungsten filament bulb 32 is shown removed from the photoconductor elements 22 and 25, in actual practice, of course, it is disposed so that its illumination falls on the photoconductor elements. The novel combination consisting of the non-linear direct current amplifier 30, tungsten filament bulb 32, and operational amplifier comprising the elements 22, 23 and 24, has the characteristic that the voltage gain of the amplifier varies substantially logarithmically with the direct current voltage provided by the integrator 29.

It is understood that instead of an incandescent light source, such as a tungsten filament bulb, other types of sources of illumination may be used, such as a gas-discharge type of electroluminiscent light sources, in conjunction with a non-linear direct current amplifier having the proper transfer function for the source employed.

Figure 3:
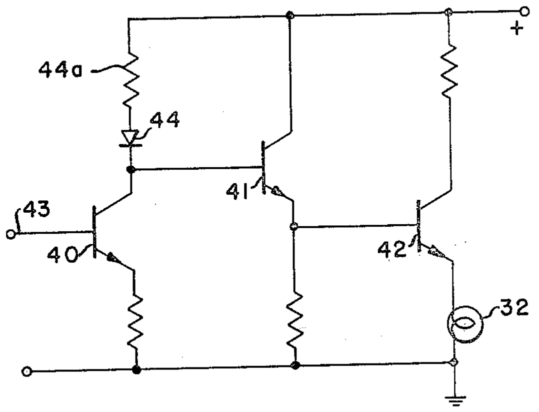

Referring now to FIGURE 3, there is shown a schematic diagram of the non-linear amplifier 30. The amplifier utilizes three direct coupled stages 40, 41 and 42 with the stages 41 and 42 being connected in an emitter follower configuration. The integrator 29 is coupled to the base of the first stage 40 by a lead 43. The collector current of transistor 40 will be determined by the voltage impressed between lead 43 and ground. The collector circuit of 40 comprises the semiconductor diode 44 and the resistor 44*a*. As the collector current increases, the dynamic resistance of diode 44 decreases, and the voltage gain of this stage is reduced accordingly. The voltage increment appearing across bulb 32 is therefore a non-linear function of the voltage increment impressed between 43 and ground. By the proper choice of diode 44 and resistor 44*a*, the desired non-linear voltage gain characteristic is achieved for amplifier 30.

From the above description it can be appreciated that a simple AGC unit has been provided in which the control of the two amplifiers 23 and 26 is effected by controlling the magnitude of a resistance disposed in the gain control section of these amplifiers. The photoconductive elements 22 and 25 being substantially pure resistance type elements do not introduce distortion in the signal as it passes from one amplifying stage to the next. The use of the integrating circuit 29 and non-linear amplifier 30 provides a simple means by which the signal from the output side of the amplifier 26 may be readily converted to a direct current signal which renders the attenuation characteristics logarithmic. Initially amplifier 30 is biased in such a manner that the brilliance of bulb 32 is maximum. Then, as the signal at 20 increases beyond AGC threshold, the illumination of the lamp 32 will decrease as the amplitude of the signal from the amplifier 30 increases. This will cause an increase in the resistance of the photoconductor elements 22 and 25 thus decreasing the gain of the amplifiers 23 and 30. The fact that the photoconductor elements 22 and 25 are pure resistance type elements permits them to be used in the gain control section of the amplifiers.

While no particular construction has been set for the amplifiers described above, they may be either vacuum tube type amplifiers or solid state amplifiers. An important feature of this invention is the use of a pure resistive type element as the gain controlling element in the gain section of an amplifier. Furthermore, the resistance of the gain control element is varied substantially logarithmically with a direct current voltage through the combination of a non-linear amplifier 30 and light source 32. Thus, substantially constant AGC reaction rates are achieved over the operation range of the device. If solid-state single-ended amplifiers are used, each of the photoconductive elements can effect a gain control over a range of substantially 30 decibels.

While but a single embodiment of this invention has been described, it should not be limited to the particular features and structure described but only to its broad spirit and scope. In particular, the control method disclosed in this invention should not be limited to seismic amplifiers, since it is equally useful for the gain control of audio and radio frequency amplifiers, as well as for the control of radio transmitters with envelope feedback.

I claim as my invention:

1. An automatic gain control for amplifiers comprising: an amplifier having an input and output terminal; a light-sensitive device having substantially pure resistance, the resistance of said device varying with the quantity of illumination that falls on said device, said device being coupled in series with the input of said amplifier; the output of said amplifier being coupled to a rectifying circuit; said rectifying circuit being coupled to an integrating circuit having an adjustable time constant; said integrating circuit being coupled to a non-linear direct current amplifier and said direct current amplifier being coupled to a light source, and said light source being disposed to illuminate said device whereby the signal from said direct current amplifier will vary the illumination given off by said light.

2. An automatic gain control for amplifiers comprising: an amplifier having input and output terminals; a light-sensitive device having substantially pure resistance, the resistance of said device varying with the illumination that falls on said device; said device being coupled in series with the input terminal of said amplifier; the output of said amplifier being coupled to a rectifying circuit, said rectifying circuit being coupled to a non-linear amplifier and said non-linear amplifier being coupled to a light source, said light source being disposed to illuminate said device whereby the resistance of said device will vary in relation to the output signal of said non-linear amplifier.

3. An automatic gain control for amplifiers comprising: a first amplifier having an input and output terminal; a light-sensitive device having substantially pure resistance, the resistance of said device varying with the quantity of illumination that falls on said device, said device being coupled in series with the input of said first amplifier; the output of said amplifier being coupled to a rectifying circuit; said rectifying circuit being coupled to a second amplifier disposed to integrate the rectified signal and having an adjustable time constant; said second amplifier being coupled to a non-linear direct current amplifier and said direct current amplifier being coupled to a tungsten filament light, said light being disposed to illuminate said device whereby the signal from said direct current amplifier will vary the illumination given off by said light.

4. An automatic gain control for amplifiers comprising: an amplifier having an input and output terminal; a light-sensitive device having substantially pure resistance, the resistance of said device varying with the quantity of illumination that falls on said device, said device being disposed in the feedback loop of an amplifier; the output of said amplifier being coupled to a rectifying circuit; said rectifying circuit being coupled to an integrating circuit having an adjustable time constant; said integrating circuit being coupled to a non-linear direct current amplifier and said direct current amplifier being coupled to a light source, said light source being disposed to illuminate said device whereby the signal from said direct current amplifier will vary the illumination given off by said light.

5. An automatic gain control for amplifiers comprising: an amplifier having an input and output terminal; a light-sensitive device having substantially pure resistance, the resistance of said device varying with the quantity of illumination that falls on said device, said device being disposed as one of the gain determining resistors of an operational feedback amplifier; the output of said amplifier being coupled to a rectifying circuit; said rectifying circuit being coupled to an integrating circuit having an adjustable time constant; said integrating circuit being coupled to a non-linear direct current amplifier and said direct current amplifier being coupled to a light source, and said light source being disposed to illuminate said device whereby the signal from said direct current amplifier will vary the illumination given off by said light.

References Cited in the file of this patent

UNITED STATES PATENTS

| | | |
|---|---|---|
| 1,843,288 | Leonard | Feb. 2, 1932 |
| 3,020,488 | Miranda et al. | Feb. 6, 1962 |
| 3,072,795 | Badmaieff | Jan. 8, 1963 |